United States Patent [19]
Vogt et al.

[11] Patent Number: 4,607,275
[45] Date of Patent: Aug. 19, 1986

[54] SEMICONDUCTOR ELEMENT WITH DISK-SHAPED HOUSING

[75] Inventors: Herbert Vogt; Werner Egerbacher, both of Munich; Dieter Wunderlich, Olching-Geiselbullach; Werner Mitzkus, Munich, all of Fed. Rep. of Germany

[73] Assignee: Siemens Aktiengesellschaft, Berlin and Munich, Fed. Rep. of Germany

[21] Appl. No.: 586,589

[22] Filed: Mar. 6, 1984

[30] Foreign Application Priority Data

Mar. 11, 1983 [DE] Fed. Rep. of Germany ....... 3308720

[51] Int. Cl.⁴ .................. H02G 13/08; H01L 23/32
[52] U.S. Cl. ........................................ 357/79; 357/74; 174/52 P
[58] Field of Search ............. 174/52 P, 52 S, 52 PE; 357/74, 79

[56] References Cited

U.S. PATENT DOCUMENTS

| 3,558,999 | 1/1971 | Palies | 357/74 |
| 3,688,163 | 8/1972 | Daniels et al. | 357/74 |
| 4,274,106 | 6/1981 | Ohdate | 357/74 |
| 4,399,452 | 8/1983 | Nakashima et al. | 357/74 |

FOREIGN PATENT DOCUMENTS

| 0034208 | 2/1980 | European Pat. Off. | |
| 2654532 | 2/1976 | Fed. Rep. of Germany | 357/79 |
| 2719400 | 4/1977 | Fed. Rep. of Germany | 357/79 |
| 2024514 | 6/1979 | United Kingdom | 357/79 |

Primary Examiner—James W. Davie
Assistant Examiner—Vangelis Economou
Attorney, Agent, or Firm—John F. Moran

[57] ABSTRACT

A disk-shaped housing for a semiconductor element comprising a cup (1) of insulating material with an opening (2) at the bottom. Through this opening (2) passes a contact surface (4) of one of two plate type connecting bodies (3), between which lies a pressure-contacted semiconductor body (14). Both connecting bodies (3, 5) comprise radially and axially oriented seal surfaces (8, 9; 11, 12), against which there abuts under pressure an elastic ring (13) which surrounds the semiconductor body. The cup is filled with sealing compound (18); the semiconductor body is thus protected against penetration of the sealing compound.

19 Claims, 4 Drawing Figures

SEMICONDUCTOR ELEMENT WITH DISK-SHAPED HOUSING

BACKGROUND OF THE INVENTION

The invention relates to a semiconductor element with two disk-shaped connecting bodies each comprising an outer contact surface between which the two surfaces a semiconductor body is arranged. The element includes a cup of insulating material filled at least partially with casting compound or sealing compound, and having an opening at the bottom of the cup closed by one of the connecting bodies. The sealing compound surrounds the semiconductor body and the connecting bodies leaving the contact surfaces exposed.

Such a semiconductor element has been described for example in European patent application No. 0 034 208. In that semiconductor element the semiconductor body is soldered to the connecting bodies. To protect the semiconductor body against the sealing compound, the semiconductor body is wrapped in protective lacquer which fills the free space between the connecting bodies.

In semiconductor elements contacted by pressure contacts, the semiconductor body is not soldered to the connecting bodies but is placed loosely between the connecting bodies. Sealing compound must then be prevented from penetrating the area between the connecting bodies and the semiconductor body. Using a protective lacquer between the semiconductor body and the sealing compound can not be used, as the protective lacquer itself tends to wet the contact surfaces between the semiconductor body and the connecting bodies.

SUMMARY OF THE INVENTION

It is an object of the invention to disclose a semiconductor element of the type described which is so fabricated that when pressure contact is used penetration of the casting compound, or sealing compound, is prevented.

This and other objects are achieved by providing that the connecting bodies have on their sides facing each other concentric seal surfaces at their edges; that at least one elastic ring is fitted between these seal surfaces; and that the ring is applied against the seal surfaces under pressure at least on the end face.

Other features and advantages of the invention will be apparent from the following description of the preferred embodiments, and from the claims.

For a full understanding of the present invention, reference should now be made to the following detailed description of the preferred embodiments of the invention and to the accompanying drawings.

DETAILED DESCRIPTION

Figure 1:
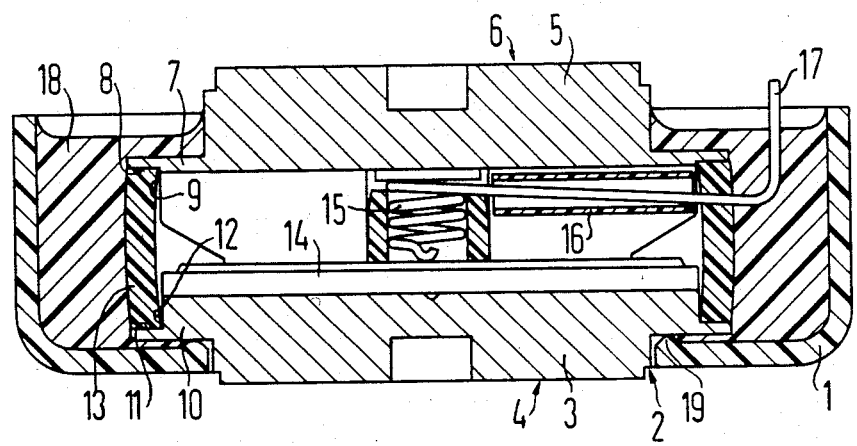
FIGS. 1 to 4 show four different embodiments of the semiconductor element.

The semiconductor element according to FIG. 1 has a cup 1 of insulating material which is provided at the bottom with an opening 2. The opening 2 is closed by a first connecting body 3. The connecting body 3 has an outer contact surface 4 which protrudes somewhat from the bottom of cup 1. Alternatively, it may be flush with the bottom. On the connection body 3 is fitted a semiconductor body 14, consisting for example of a molybdenum disk and a silicon disk alloyed thereto. At the top side the semiconductor body 14 is contacted by a second connecting body 5 with an outer contact surface 6. This contact surface 6 protrudes over the top edge of cup 1 but may alternatively be at the same level. The connecting bodies 3, 5 are provided with radial shoulders 10, 7. The shoulders 7 and 10 have mutually concentric first seal surfaces 8, 11 and second seal surface 9, 12. In the embodiment, the first seal surface 8, 11 have radial directions, while the seal surfaces 9, 12 are formed by a peripheral surface of the connecting bodies. Here the second seal surfaces are axially oriented. Alternatively, however, the seal surfaces may be inclined on the axis or respectively on the radius of the connecting bodies. Alternatively the first and second seal surfaces can form a single surface, e.g. an arched one.

Against the seal surfaces 8, 9, 11, 12 is applied an elastic ring 13 of insulating material whose height in the unloaded state is greater than the distance between the seal surfaces 8 and 11. When the connecting bodies 3 and 5 are pressed together, it is compressed somewhat, so that its end faces fit tighly against the seal surfaces 8, 11. To facilitate assembly and to increase the tightness, the elastic ring 13 can also be applied against the seal surfaces 9, 12 under pressure. This results in a manageable semiconductor unit which can be assembled before insertion in cup 1 and can be tested electrically. The connecting bodies 3, 5 elastic ring 13, and semiconductor body 14 making up the unit are firmly connected with one another and with cup 1 by filling liquid casting compound 18 into cup 1. The union is especially good when the shoulders 7, 10 are covered externally by the sealing compound. As the casting compound 18 is being poured in, the connecting body 3 must be pressed against the connecting body 5, to prevent penetration of casting compound into the interior of the ring. Emergence of casting compound through the opening 2 is prevented by the action of a lip 19 which surrounds the opening 2, and on which the connecting body 3 is seated. After solidification of the casting compound, the connecting bodies 3, 5 can be relieved. They are now held together by the sealing compound 18. To make it operational, the semiconductor element is squeezed between two cooling bodies which provide the necessary contact pressure between the connecting bodies and the semiconductor body.

If the semiconductor body 14 is a thyristor disk, it is contacted with a control contact 15. The latter may exist for example of a spiral spring which is fitted under electric insulation in a central recess of the connecting body 5. The control contact 15 is connected with a control line 17, which in insulated for example by an insulating tube 16 and arranged in a slit in the connecting body 5. The control line 17 pierces the body of the elastic ring 13.

Figure 2:
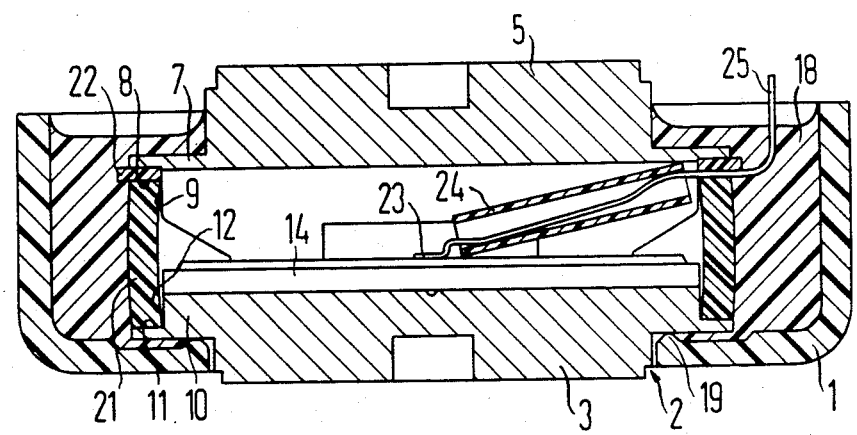

The semiconductor element according to FIG. 2 differs from that according to FIG. 1 essentially in that instead of a single elastic ring two mutually concentric elastic rings 21, 22 are used. These rings abut by their end faces under pressure and in turn seal through contacting against the seal surfaces 8, 11 and possibly against the seal surfaces 9, 12. The first elastic ring 21 embraces a peripheral surface, formed as seal surface, of the connecting body 3, and a part of a peripheral surface of the connecting body 5. The second elastic ring 22 is substantially lower and embraces only a peripheral surface of the connecting body 5. In the embodiment according to FIG. 2 it is shown that the outside diameter of the elastic ring 22 is greater than that of the elastic ring 21. Alternatively, however, the two outside diameters may be the same. On the other hand, the inside diameters of the elastic rings may be different.

The semiconductor body 14 is contact with a control contact 23. The latter is connected with a control line 25 extending in a slit in the connecting body 5. The control line 25 goes to the outside between the mutually abutting end faces of the rings 21, 22. For filling the cup 1 again the connecting bodies 3 and 5 are squeezed one against the other, thereby avoiding the penetration of casting compound both between the rings and the connecting bodies and at the point of passage of the control line 25.

Figure 3:
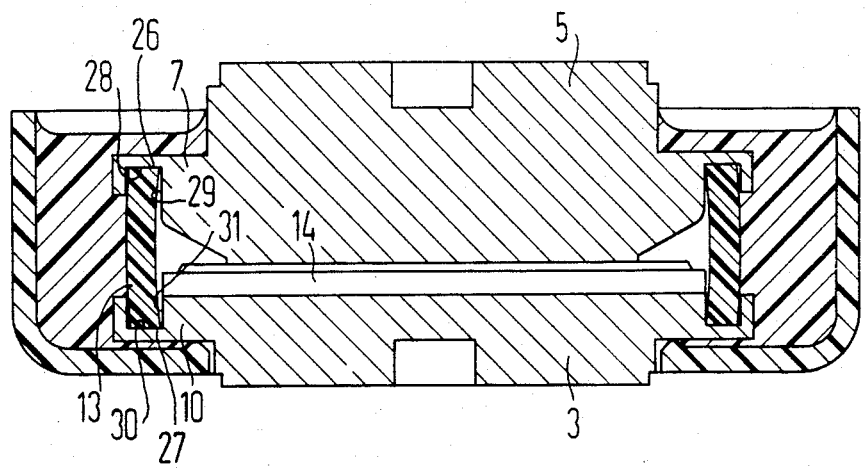

The semiconductor element according to FIG. 3 differs from that according to FIG. 1 essentially in that the ends of the elastic ring 13 are fitted in grooves 26, 27 which are disposed at the mutually facing sides of the shoulders 7, 10. The grooves form first sealing surfaces 28 and 30 and second sealing surfaces 29, 31 at the periphery of the connecting bodies. This design is a capsule for a diode disk or die, or it may alternatively encapsulate a thyristor chip, in which case an appropriate recess and an appropriate slit must be provided as in the embodiments according to FIGS. 1 and 2.

Figure 4:
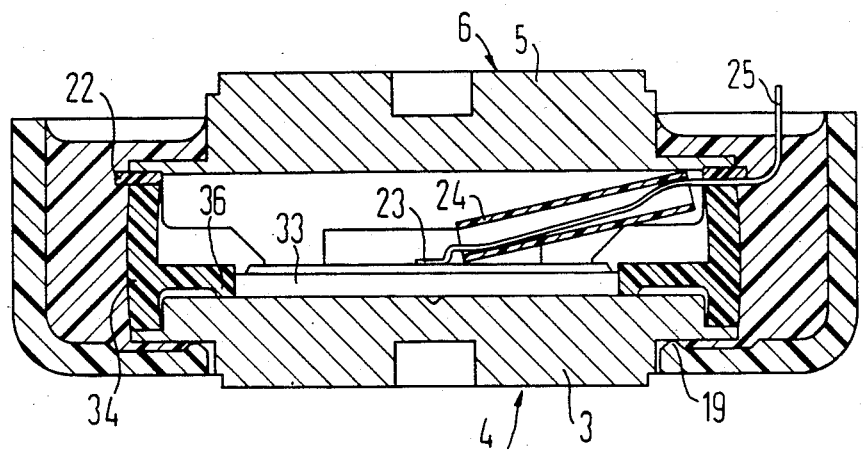

The elastic rings according to the embodiments of FIGS. 1 to 3 are cylindrical. At the same time they center the semiconductor body 14 inside the housing if the latter's outside diameter is the same as the inside diameter of the ring. If the diameter of the semiconductor body is smaller than the inside diameter of the ring, the ring (34 in FIG. 4) may be provided on its inner side with a radially recessing shoulder 36. The ring 34 may take care of the sealing together with a second ring 22, or alternatively a one-piece ring with a corresponding inner shoulder may be used. Accordingly, also in this embodiment the control connections shown in FIG. 1 or in FIG. 2 may be used. For encapsulation of a diode according to FIG. 3 the embodiment according to FIG. 4 may be used also.

There has thus been shown and described a novel housing for a semiconductor element which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. In a semiconductor element having two disk-shaped connecting bodies each including an outer contact surface a semiconductor body is placed loosely between the two connecting bodies, and a cup made of insulating material filled at least in part with casting compound containing the two connecting bodies located therein, said cup having an aperture in its bottom region wherein a portion of one of said connecting bodies extends through to provide the outer contact surface of the one connecting body, said casting compound surrounding the region of said semiconductor body and contacting said connecting bodies while leaving the outer contact surface of the other connecting body exposed, said connecting bodies including on their sides facing each other radially projecting shoulders defining concentric seal surfaces at the edge of said connecting bodies, said element also comprising at least one elastic ring fitted between said seal surfaces, said elastic ring being applied against said seal surfaces under pressure at least on the planar end face of said elastic ring serving to prevent penetration of the casting compound into the interior of the elastic ring while embedding a portion of the shoulder external to the elastic ring with the casting compound.

2. Semiconductor element according to claim 1, wherein each of said connecting bodies comprises a radial and an axial seal surface and that said ring is applied under pressure against the axial and the radial seal surfaces.

3. Semiconductor element according to claim 1, wherein each of said connecting bodies comprises a radial and an axial seals surface and that said ring is applied under pressure against the axial and the radial seal surfaces.

4. Semiconductor element according to claim 1, wherein between said seal surfaces two mutually concentric elastic rings are fitted, said rings being abutted under pressure at their planar end faces, wherein the first ring abuts at the axial seal surfaces of both connecting bodies and wherein said second ring is narrower than the first ring and abuts only at the axial seal surface of one of said connecting bodies.

5. Semiconductor element according to claim 1, wherein between said seal surfaces two mutually concentric elastic rings are fitted, said rings being abutted under pressure at their end faces, wherein the first ring abuts at the axial seal surfaces of both connecting bodies and wherein said second ring is narrower than the first ring and abuts only at the axial seal surface of one of said connecting bodies.

6. Semiconductor element according to claim 2, wherein between said seal surfaces two mutually concentric elastic rings are fitted, said rings being abutted under pressure at their planar end faces, wherein the first ring abuts at the axial seal surfaces of both connecting bodies and wherein said second ring is narrower than the first ring and abuts only at the axial seal surface of one of said connecting bodies.

7. Semiconductor element according to claim 3, wherein between said seal surfaces two mutually concentric elastic rings are fitted, said rings being abutted under pressure at their planar end faces, wherein the first ring abuts at the axial seal surfaces of both connecting bodies and wherein said second ring is narrower than the first ring and abuts only at the axial seal surface of one of said connecting bodies.

8. Semiconductor element according to claim 1, wherein said semiconductor body is contacted with a control line, said control line passing through the body of said elastic ring.

9. Semiconductor element according to claim 1, wherein said semiconductor body is contacted with a control line, said control line passing through the body of said elastic ring.

10. Semiconductor element according to claim 2, wherein said semiconductor body is contacted with a control line, said control line passing through the body of said elastic ring.

11. Semiconductor element according to claim 3, wherein said semiconductor body is contacted with a control line, said control line passing through the body of said elastic ring.

12. Semiconductor element according to claim 4, wherein said semiconductor body is contacted with a control line, said control line being brought to the outside of said two rings between the abutting end faces of said two rings.

13. Semiconductor element according to claim 5, wherein said semiconductor body is contacted with a control line, said control line being brought to the outside of said two rings between the abutting end faces of said two rings.

14. Semiconductor element according to claim 6, wherein said semiconductor body is contacted with a control line, said control line being brought to the outside of said two rings between the abutting end faces of said two rings.

15. Semiconductor element according to claim 7, wherein said semiconductor body is contacted with a control line, said control line being brought to the outside of said two rings between the abutting end faces of said two rings.

16. Semiconductor element according to claim 1, wherein the opening of said cup is surrounded on its inner side by a seal lip and wherein one of said connecting bodies rests on said lip.

17. Semiconductor element according to claim 1, wherein the opening of said cup is surrounded on its inner side by a seal lip and wherein one of said connecting bodies rests on said lip.

18. Semiconductor element according to claim 2, wherein the opening of said cup is surrounded on its inner side by a seal lip and wherein one of said connecting bodies rests on said lip.

19. Semiconductor element according to claiam 6, wherein the opening of said cup is surrounded on its inner side by a seal lip and wherein one of said connecting bodies rests on said lip.

* * * * *